(12) United States Patent
Zeller

(10) Patent No.: US 11,067,655 B2
(45) Date of Patent: Jul. 20, 2021

(54) METHOD AND APPARATUS RECORDING TWO MAGNETIC RESONANCE IMAGES

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 133 days.

(21) Appl. No.: 16/426,526

(22) Filed: May 30, 2019

(65) Prior Publication Data
US 2019/0369195 A1 Dec. 5, 2019

(30) Foreign Application Priority Data
May 30, 2018 (DE) .......................... 102018208569.2

(51) Int. Cl.
| | | |
|---|---|---|
| G01V 3/00 | (2006.01) | |
| G01R 33/561 | (2006.01) | |
| G01R 33/48 | (2006.01) | |
| G01R 33/58 | (2006.01) | |
| G01R 33/56 | (2006.01) | |

(52) U.S. Cl.
CPC ..... *G01R 33/5617* (2013.01); *G01R 33/4828* (2013.01); *G01R 33/5608* (2013.01); *G01R 33/5611* (2013.01); *G01R 33/583* (2013.01)

(58) Field of Classification Search
USPC ................................................ 324/309, 307
See application file for complete search history.

(56) References Cited

U.S. PATENT DOCUMENTS

| 6,466,014 B1 * | 10/2002 | Ma ..................... G01R 33/4828 |
| | | 324/307 |
| 2008/0279433 A1 * | 11/2008 | Brau ....................... G06K 9/28 |
| | | 382/131 |

(Continued)

FOREIGN PATENT DOCUMENTS

| DE | 102016207641 A1 | 11/2017 |
| DE | 102016219052 B3 | 3/2018 |
| WO | 2011/080693 A1 | 7/2011 |

OTHER PUBLICATIONS

Breuer, Felix A. et al., "Controlled Aliasing in Parallel Imaging Results in Higher Acceleration (CAIPIRINHA) for Multi-Slice Imaging" Magnetic Resonance in Medicine, vol. 53, No. 3, pp. 684-691, 2005 // DOI: 10.1002/mrm.20401.

(Continued)

*Primary Examiner* — Vincent Q Nguyen
(74) *Attorney, Agent, or Firm* — Schiff Hardin LLP

(57) ABSTRACT

In a method for creating a first and a second image dataset of an examination object, a train of RF refocusing pulses are radiated into the examination object after the radiation of an RF excitation pulse to generate a spin echo signal after each radiated RF refocusing pulse, phase encoding gradients are activated for encoding the phases of the spin echo signals generated, and readout gradients are activated in each case in a readout window to read out the generated spin echo signals as measurement data. The readout windows alternately include a first time point at which the phases of the different spin species in the spin echo signal are the same, and a second time point at which the phases of the different spin species in the spin echo signal are not the same.

19 Claims, 8 Drawing Sheets

(56) References Cited

U.S. PATENT DOCUMENTS

| 2014/0003694 | A1  | 1/2014  | Weng |
|---|---|---|---|
| 2016/0033605 | A1  | 2/2016  | Stemmer et al. |
| 2016/0161584 | A1* | 6/2016  | Fautz .................. G01R 33/4828 |
|  |  |  | 324/309 |
| 2016/0171670 | A1* | 6/2016  | Koehler ............. G01R 33/5608 |
|  |  |  | 382/131 |
| 2017/0322280 | A1  | 11/2017 | Carinci et al. |
| 2018/0095143 | A1  | 4/2018  | Zeller |

OTHER PUBLICATIONS

Wang, Xinzeng et al. "Robust abdominal imaging with uniform fat suppression using Dixon based single shot turbo spin echo" Proc. Intl. Soc. Mag. Reson. Med., vol. 24, Abstract 0573, 2016.

Ma, J. et al. "A fast spin echo triple echo Dixon (fTED) technique for efficient T2-weighted water and fat imaging" Proc. Intl. Soc. Mag. Reson. Med., vol. 14, p. 3025, 2006.

Leinhard, O. D. et al. "Water fat shift displacement artifact correction in two point Dixon imaging" Proc. Intl. Soc. Mag. Reson. Med., vol. 16, p. 1384, 2008.

Ma, Jingfei et al. "Fast Spin-Echo Triple-Echo Dixon (fTED) Technique for Efficient T2-Weighted Water and Fat Imaging" Magnetic Resonance in Medicine, vol. 58, No. 1, pp. 103-109, 2007 // DOI: 10.1002/mrm.21268.

German office action dated Mar. 26, 2019, foreign application No. 10 2018 208 569.2.

\* cited by examiner

METHOD AND APPARATUS RECORDING TWO MAGNETIC RESONANCE IMAGES

BACKGROUND OF THE INVENTION

Field of the Invention

The invention concerns accelerated recording of two magnetic resonance images, in particular for a Dixon method.

Description of the Prior Art

Magnetic resonance (MR) technology is a known modality with which images of the interior of an examination object can be generated. In simple terms, to this end, the examination object is positioned in a strong, static, homogeneous basic magnetic field, also called a $B_0$ field, with field strengths of 0.2 tesla to 7 tesla and more in a magnetic resonance scanner, such that the nuclear spins of the subject are aligned along the basic magnetic field. To trigger nuclear spin resonances, radio-frequency excitation pulses (RF pulses) are radiated into the examination object, the triggered nuclear spin resonances are measured as echo signals that are stored in a memory as so-called k-space data, and MR images are reconstructed (or spectroscopy data determined) on the basis thereof, for example by a multi-dimensional Fourier transform. Generally, rapidly activated magnetic gradient fields are superimposed on the basic magnetic field for spatial encoding of the measurement data.

There are basically two methods for generating echo signals following excitation of the nuclear spins. The excited nuclear spins can be manipulated by activating dephasing and rephasing gradients in such a way that the signal decays more quickly than accounted for by the T2* decay inherent in the excited tissue, but, after a certain time (the echo time (TE)) after the RF excitation pulse, a so-called gradient echo (GRE) forms, which is to be measured (detected). Such sequences are usually called GRE sequences. Another technique is to generate a so-called spin echo signal (SE) by radiating at least one RF refocusing pulse following the radiation of an RF excitation pulse after a time, again called the echo time, after the RF excitation pulse. This spin echo signal is measured but has an amplitude reduced in accordance with the T2 decay inherent in the measured tissue. Such sequences are usually called SE sequences. There are also sequences that generate both gradient echoes and spin echoes, for example (true) FISP sequences. In each case, the excitation and the measurement of the echo signal generated is repeated as necessary for each sequence (for example by activating different gradients for spatial encoding) until the desired number of echo signals has been measured and stored in k-space in order to enable the examination object to be imaged.

SE sequences commonly used in clinical application are in particular TSE sequences (TSE: "Turbo Spin Echo"), which are also known as FSE ("Fast Spin Echo") or RARE ("Rapid Acquisition with Refocused Echoes") sequences. The advantage of TSE sequences over a "simple" SE sequence is that, after an RF excitation pulse, a plurality of refocusing pulses are activated and that as a result, a plurality of spin echo signals, also called a train of echo signals, is also generated. This accelerates data acquisition.

With so-called "single-shot" methods, the entire amount of k-space data that need to be recorded, for example for imaging a slice of an examination object to be imaged, can be recorded after only one RF excitation by an RF excitation pulse.

One example of such a single-shot TSE sequence is the HASTE sequence ("Half-Fourier Acquisition Single-shot Turbo spin Echo imaging") in which, additionally a "partial Fourier" method, in particular the half-Fourier method is used in order to reduce the amount of k-space data that need to be recorded. The symmetry of k-space with respect to complex conjugation is used in order to derive non-measured k-space data from the measured k-space data. If slices of an examination object are to be measured, it is, for example, possible for all k-space data of a slice to be recorded by means of HASTE after only one excitation. Therefore, HASTE-techniques are usually used for recordings of the thorax or abdomen where they enable coverage of a relatively large volume of interest (VOI) within one or more breath-holding phases wherein sensitivity to physiological movements of the examination object has been reduced as a result of the accelerated measurement.

HASTE recording techniques are inter alia also known as SS-FSE (single-shot fast spin echo), SSH-TSE (single-shot turbo spin echo), UFSE (ultra-fast spin echo), single-shot fast SE or FASE or super-FASE (fast advanced spin echo).

FIG. 1 is a schematic sequence diagram of such a HASTE sequence showing its temporal profile. As mentioned, after an excitation pulse RF1, a number of refocusing pulses RF2 are activated in order to generate a plurality of spin echo signals each of which forms between the refocusing pulses RF2 (not shown). In order to limit the excitation spins of a specific slice, a corresponding slice selection gradient GS can be activated simultaneously with each excitation pulse RF1 and refocusing pulse RF2. For further spatial encoding, it is possible to activate regularly arranged frequency encoding gradients GF (during the readout process) and phase encoding gradients GP. With HASTE it is possible to dispense with some (generally barely half) of the phase encoding gradients GP, as is indicated in FIG. 1 by the asymmetric arrangement of the phase encoding gradients GP. The corresponding, "missing" spin echo signals can, as stated, be supplemented by a partial Fourier method. The depicted asymmetric arrangement of the phase encoding gradients GP, with which a greater number of echo signals is measured after the measurement of the echo signals in the center of k-space (GP=0) than before the measurement of the center of k-space is advantageous in order to minimize the length of the echo times at which the region of the center of k-space (low amplitudes of the phase encoding gradients GP) is measured. In this way, the echo signals of the central k-space region are less strongly attenuated in accordance with the T2 decay than with another arrangement which only measures the central k-space region at later echo times.

Also known in addition to the cited partial Fourier method are so-called parallel acquisition techniques (for example GRAPPA ("GeneRalized Autocalibrating Partially Parallel Acquisition") and SENSE ("SENSitivity Encoding") with the use of which acquisition times required for recording the desired data can be reduced. As with partial Fourier methods, herein, only parts of the echo signals that are actually to be acquired according to the Nyquist condition are measured as k-space data. In contrast to partial Fourier methods, however, the non-measured parts are generally more uniformly distributed over k-space that is to be filled (scanned) according to Nyquist's theorem, so that, for example, only every second or third (etc.) k-space line is filled with data entries. In addition, with parallel acquisition techniques, the "missing" k-space data are reconstructed with the use of coil sensitivity data. The coil sensitivity data from the receiving coils used during the recording of the measurement data are determined from reference data, which samples at least one region of k-space to be filled, completely according to the Nyquist condition, which is generally the central region of k-space.

There are numerous applications of magnetic resonance tomography in which it is desirable to differentiate between tissue types.

To this end, it is possible to exploit the fact that in the case of tissue types with different chemical shifts, at the same excitation, a different magnetic field results at the core thus resulting in different resonance frequencies. During signal recording, this results in different phase angles of the two components. The most prominent representatives of two different tissue types in the magnetic resonance signal are fat and water, but other applications are also possible. For example, it is also possible to use the phenomenon known as chemical shift to differentiate between silicone and other tissue types. The resonance frequencies of fat and water differ by about 3.3 ppm (parts per million). Hence, phase information from recorded MR signals can be used to separate the signals from different tissue types, such as, for example, fat and water.

It is common in conventional methods to acquire two magnetic resonance signals for each k-space point to be filled or entered, in order to differentiate between different tissue types, for example water-dominated and fat-dominated tissue. More precisely, with such methods, which are known, for example, as so-called two-point Dixon techniques or the like, for each k-space point to be filled (which is defined via the encoding gradients) one magnetic resonance signal is acquired with which one phase of the magnetic resonance signal of a first, for example, aqueous, tissue has the same phase as the phase of a magnetic resonance signal of a second, for example fatty, tissue ("in-phase"), and one magnetic resonance signal is acquired with which a phase of a magnetic resonance signal of the first tissue has the opposite phase to the phase of the magnetic resonance signal of the second tissue ("opposed-phase"). More generally, Dixon techniques are also known with which one signal is recorded "in-phase" and the other is recorded "out-of-phase", wherein the latter signal can also be recorded with phase positions of the different spin species of < >180°. Hereinafter, the term "opposed-phase" will be used, wherein this term is also intended to encompass the aforementioned "out-of-phase" signals. The two magnetic resonance signals for each k-space point to be acquired can then be used to differentiate between the two tissue types, for example water-dominated and fat-dominated tissue. Known variants of two-point Dixon methods include, for example, the three-point Dixon method with which three magnetic resonance signals are recorded for each k-space point to be acquired.

(Two-point) Dixon techniques are used for many diagnostic purposes, in particular to separate fat and water components, such as, for example, abdominal and breast MR imaging. TSE Dixon methods are above all regularly used to record T2-weighted water and fat-images.

Dixon methods are in particular used when other methods do not work reliably enough to separate fat and other types of tissue, for example due to magnetic field inhomogeneities. Examples of these are fat saturation methods that attempt to saturate signals from fatty tissue prior to recording so that no fat signals at all can be received, such as, for example, SPAR ("SPectral Adiabatic Inversion Recovery").

However, as described above, because two signals have to be measured for each encoding step, one "in-phase" and one "opposed-phase", TSE methods also require a number of echo trains (in each case after an RF excitation pulse) in order to record a complete set of k-space data in each case. This is disadvantageous when the increased number of k-space points to be recorded increases the measuring duration such that the measurement data is afflicted with (motion) artifacts in the desired examination region, for example due to physiological movements, such as, for example, respiration. To compensate or avoid such artifacts, it possible to use trigger methods that ensure that measurement data is in each case recorded with the same state of movement of the examination region. Alternatively, the amount of measurement data recorded can be further increased so that a kind of averaging can take place with this increased amount. Both measures result in a still longer measuring time overall.

Also known are Dixon methods, which after an RF refocusing pulse, activate the polarity of alternating (i.e. at least bipolar) gradients during the readout process to read out at least two echo signals such that at least one "in-phase" and one "opposed-phase" signal is recorded. Such methods are described in an article by Ma et al., "A fast spin echo triple echo Dixon (fTED) technique for efficient T2-weighted water and fat imaging", Proc. Intl. Soc. Mag. Reson. Med. 14, S. 3025, 2006 or also in US20160033605.

Such multipolar or even bipolar frequency encoding gradients during the readout process have the drawback that they can result in misregistrations in the frequency encoding direction (readout direction), so-called chemical shift artifacts that impair the image quality. This is described in an article by Lenhard et al. "Water fat shift displacement artifact correction in two-point Dixon imaging", Proc. Intl. Soc. Mag. Reson. Med. 16, S. 1384, 2008.

SUMMARY OF THE INVENTION

An object of the present invention is to enable the creation of first and second images of an examination object that are suitable for a Dixon method, wherein accelerated recording of the measurement data required for the reconstruction of the images is enabled and at the same time the aforementioned drawbacks are avoided, in particular the cited artifacts caused by a possible movement and/or chemical shift.

This object is achieved by a method according to the invention for creating first and second image datasets of an examination object arranged in a measurement volume of a magnetic resonance scanner, which contains at least two different spin species. In the method, an RF excitation pulse is radiated into the examination object and a train of at least two RF refocusing pulses is also radiated into the examination object after the radiation of the RF excitation pulse in order to generate a spin echo signal after each radiated RF refocusing pulse. Phase encoding gradients are activated for encoding the phases of the spin echo signals generated. Furthermore, readout gradients are activated in each case in a readout window for reading out the spin echo signals generated, such that the readout windows alternately have a first time point at which the phases of the different spin species in the spin echo signal are the same, and a second time point at which the phases of the different spin species in the spin echo signal are not the same, in particular are opposed. The measurement data (raw data) are recorded during the readout windows. A first image is reconstructed from measurement data recorded in readout windows containing the first time point, and a second image is reconstructed from measurement data recorded in readout windows containing the second time point.

The alternating recording of "in-phase" spin echo signals and "opposed-phase" spin echo signals within a train of spin echoes after an RF excitation pulse renders the recorded measurement data particularly insensitive to artifacts caused by movement of the examination object. The fact that only one spin echo signal is read out after each RF refocusing pulse enables the time spacing between two successive RF refocusing pulses, and hence also the time spacing between two successive spin echo signals (so-called "echo spacing"), to be kept particularly short.

The readout gradients in the inventive method, i.e. the gradients activated in the readout direction, can be monopolar, i.e. the polarity of the readout gradients remains the same between two RF refocusing pulses. This avoids chemical-shift artifacts.

First and second images according to the invention can be combined with one another using Dixon methods such that specific images can be created that only show one of the different spin species. Hence, it is in particular possible to separate the two spin species fat and water such that pure fat images and/or pure water images can be created. Hence, in routine clinical practice, it is possible to create desired images that do not display any fat signals. In contrast to fat suppression methods with which it is attempted to generate no fat signals at all, but which are susceptible to inhomogeneities, for example in the magnetic fields in the examination region, Dixon methods enable more reliable separation of the fat signal. Due to the short measuring time for recording the measurement data achievable with the method according to the invention, the method according to the invention enables this also to be achieved for examination regions that are moved by respiration.

The method according to the invention enables substantially all measurement data for the reconstruction of a first or second image to be generated and recorded after a single RF excitation pulse, thus enabling a "single-shot" Dixon method. In particular, the measurement data for the reconstruction of a first image and a second image according to the invention can be recorded by means of a HASTE method as described above. This enables particularly fast recording of the required measurement data.

The measuring time can be further reduced if the measurement data recorded for the reconstruction of a first or second image are incomplete, and are supplemented by supplementary procedures before images are reconstructed. Such supplementary methods can be the above-described partial Fourier method and parallel acquisition techniques, which can also be combined.

If a supplementary method is used that requires calibration data, for example coil sensitivity data for parallel acquisition techniques, the calibration data can be recorded separately. It is also possible to record the calibration data directly after a last RF refocusing pulse of a train of RF refocusing pulses according to the invention in order, for example, to reduce sensitivity of the supplementary method to physiological movements.

If first and second measurement datasets are readout completely in a central region of k-space, the calibration data can also be created directly based on the recorded measurement data.

It is thereby possible to create an individual set of calibration data for both the first measurement data and for the second measurement data. This can increase the quality of the results of the supplementary methods.

The method can also be used for three-dimensional (3D) measuring methods. An example of a known 3D TSE sequence is the SPACE ("Sampling Perfection with Application optimized Contrasts using different flip angle Evolutions") sequence.

It is also conceivable to record the measurement data and recorded for the reconstruction of a first and second image after a number of RF excitation pulses as a result of which spatial resolution can be improved.

It is possible to use two RF excitation pulses with a subsequent train of RF refocusing pulses to keep the measuring time short nevertheless, wherein the second RF excitation pulse for this purpose is already radiated at a repetition time after the last RF excitation pulse. The repetition time corresponds to the recording time for all k-space data that normally need to be recorded for a measurement dataset in an examination region. Hence, the second RF excitation pulse is activated as soon as possible directly following the end of the train of RF refocusing pulses and the recording of all k-space data after the first RF excitation pulse. If, for example, the examination region is a slice, all k-space data of this slice is read out with all phase encoding gradients provided within a repetition time. Herein, in particular using the above-described supplementary techniques, it is nevertheless possible to achieve an overall shorter measuring time than is the case with conventional TSE-Dixon methods, with which all "in-phase" spin echo signals and all "opposed-phase" spin echo signals are each recorded in an "individual" train of RF refocusing pulses. If the measurement data MDS1, which are recorded after a second RF excitation pulse, are recorded with the same spatial encoding as that of the measurement data MDS2 during the recording after the first RF excitation pulse; and the measurement data MDS2 recorded after a second RF excitation pulse are recorded with the same spatial encoding as that of the measurement data MDS1 during the recording after the first RF excitation pulse, the signal-to-noise ratio and the quality of the reconstruction and/or supplementation can be improved.

A magnetic resonance apparatus according to the invention has a scanner with a basic field magnet, a gradient unit, a radio-frequency unit and a control computer with a radio-frequency transmitting/receiving controller designed to carry out a method according to the invention.

The present invention also encompasses a non-transitory, computer-readable data storage medium encoded with programming instructions that, when loaded into a computer or computer system of an magnetic resonance apparatus, cause the computer or computer system to implement any or all embodiments of the method according to the invention, as described above.

The advantages and embodiments described for the method apply analogously to the magnetic resonance apparatus and the electronically readable data carrier.

DESCRIPTION OF THE PREFERRED EMBODIMENTS

Figure 1:
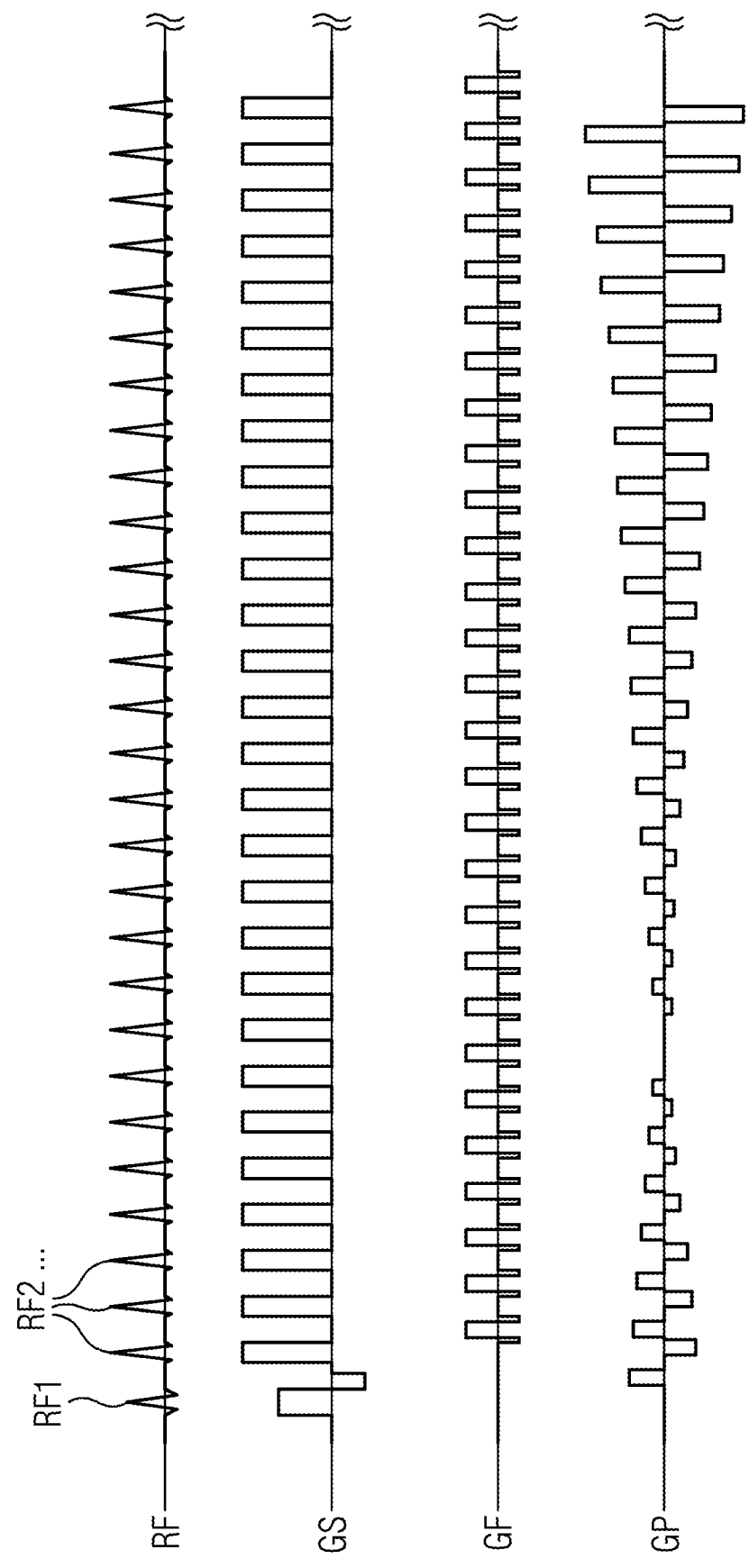
FIG. 1 is a schematic depiction of a HASTE sequence.
Figure 2:
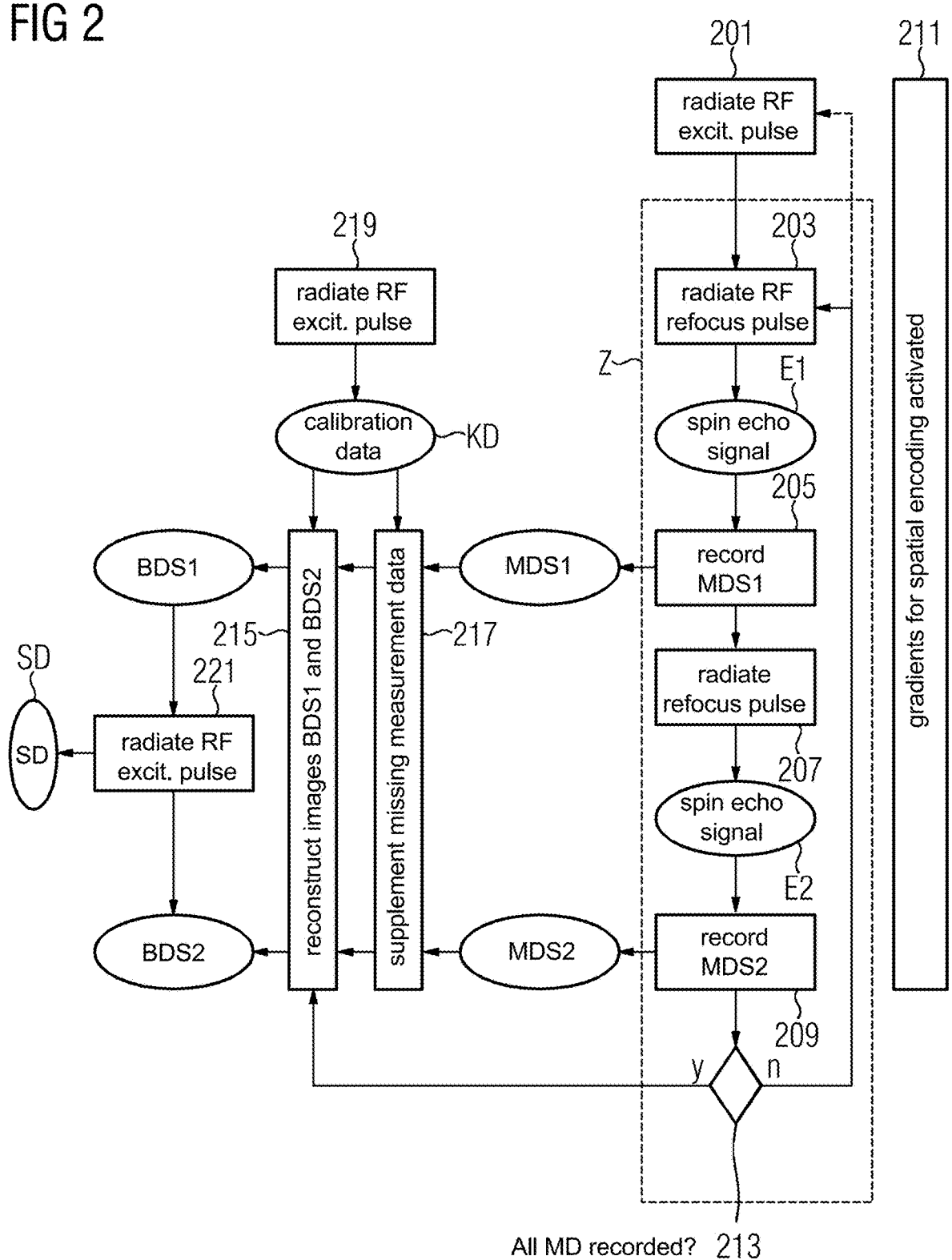
FIG. 2 shows a schematic sequence diagram of the method according to the invention.

FIG. 2 is a schematic sequence diagram of a method according to the invention for creating a first and a second image dataset of an examination object arranged in a measurement volume of a magnetic resonance system, which comprises at least two different spin species.

An RF excitation pulse is radiated into an examination object U (block 201). The RF excitation pulse manipulates the magnetization of spins in a measurement volume FOV in the examination object P.

After the radiation 201 of the RF excitation pulse RF1, a train Z of at least two RF refocusing pulses RF2 is radiated into the examination object U, wherein a spin echo signal is generated after each radiated RF refocusing pulse RF2.

Herein, an RF refocusing pulse RF2 can be radiated (block 203) that generates a spin echo signal E1, which is recorded in a readout window AF as measurement data MDS1 (block 205). Following this, a further RF refocusing pulse RF2 is radiated (block 207), which generates a spin echo signal E2, which in is recorded in a readout window AF as measurement data MDS2 (block 209).

The readout windows belonging to successive RF refocusing pulses RF2 are arranged temporally such that the readout windows alternately comprise a first time point at which the phases of the different spin species in the spin echo signal Ei are the same and a second time point at which the phases of the different spin species in the spin echo signal Eo are not same, but, for example, are opposed. Hence, when a read-out spin echo signal E1 is a spin echo signal Ei with which the phases of the different spin species are the same, the following read-out spin echo signal E2 is a spin echo signal Eo with which the phases of the different spin species not are the same; and vice versa, when a read-out spin echo signal E1 is a spin echo signal Eo with which the phases of the different spin species not are the same, the following read-out spin echo signal E2 is a spin echo signal Ei with which the phases of the different spin species are the same.

Before, during and after the radiation of the RF pulses and the recording of the measurement data in the readout windows (blocks 201-209), gradients for the spatial encoding, in particular phase encoding gradients and readout gradients, and possibly also slice selection gradients, can be activated (block 211).

Figure 3:
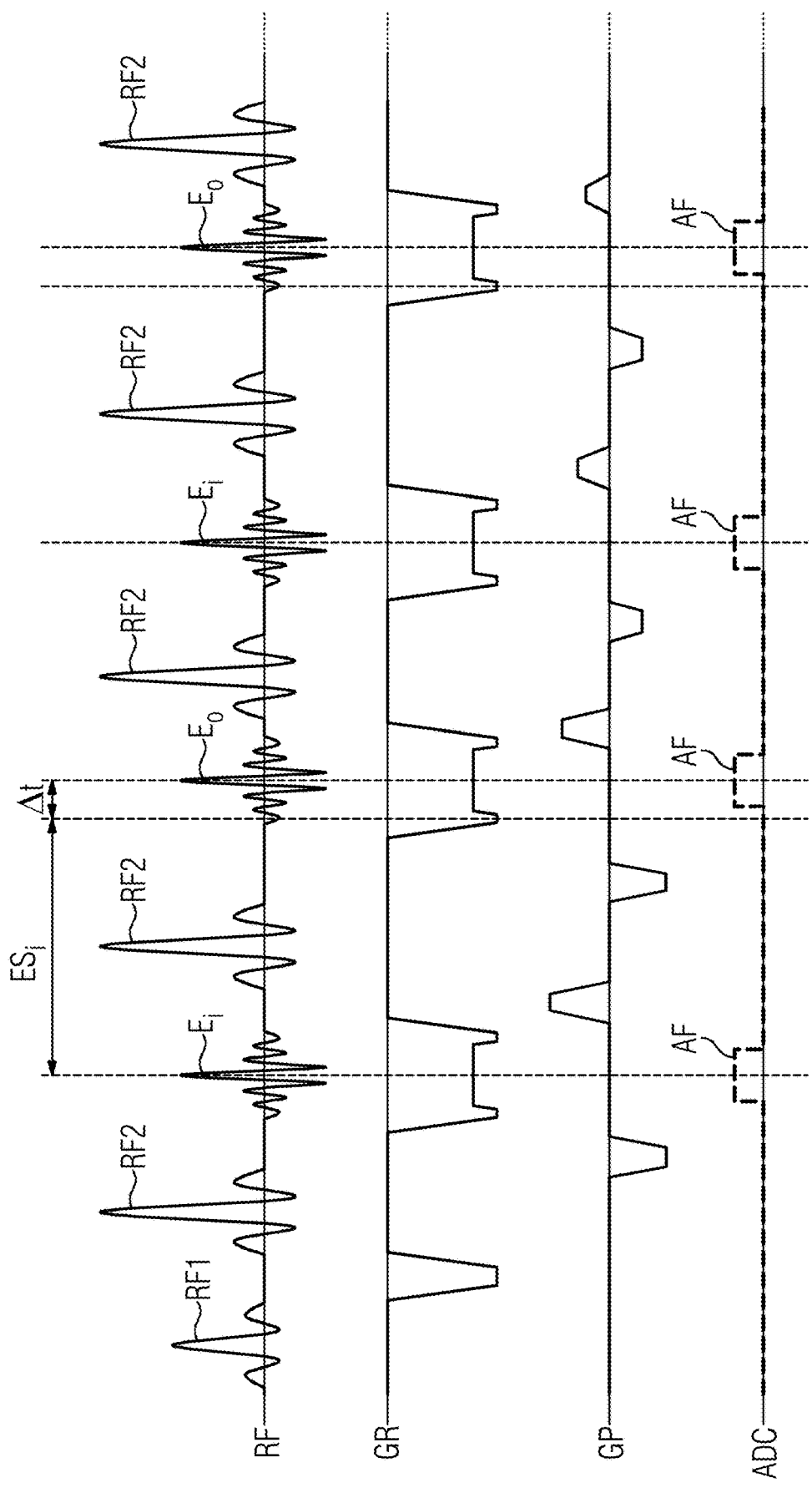
FIG. 3 shows an example of a sequence pattern.
Figure 5:
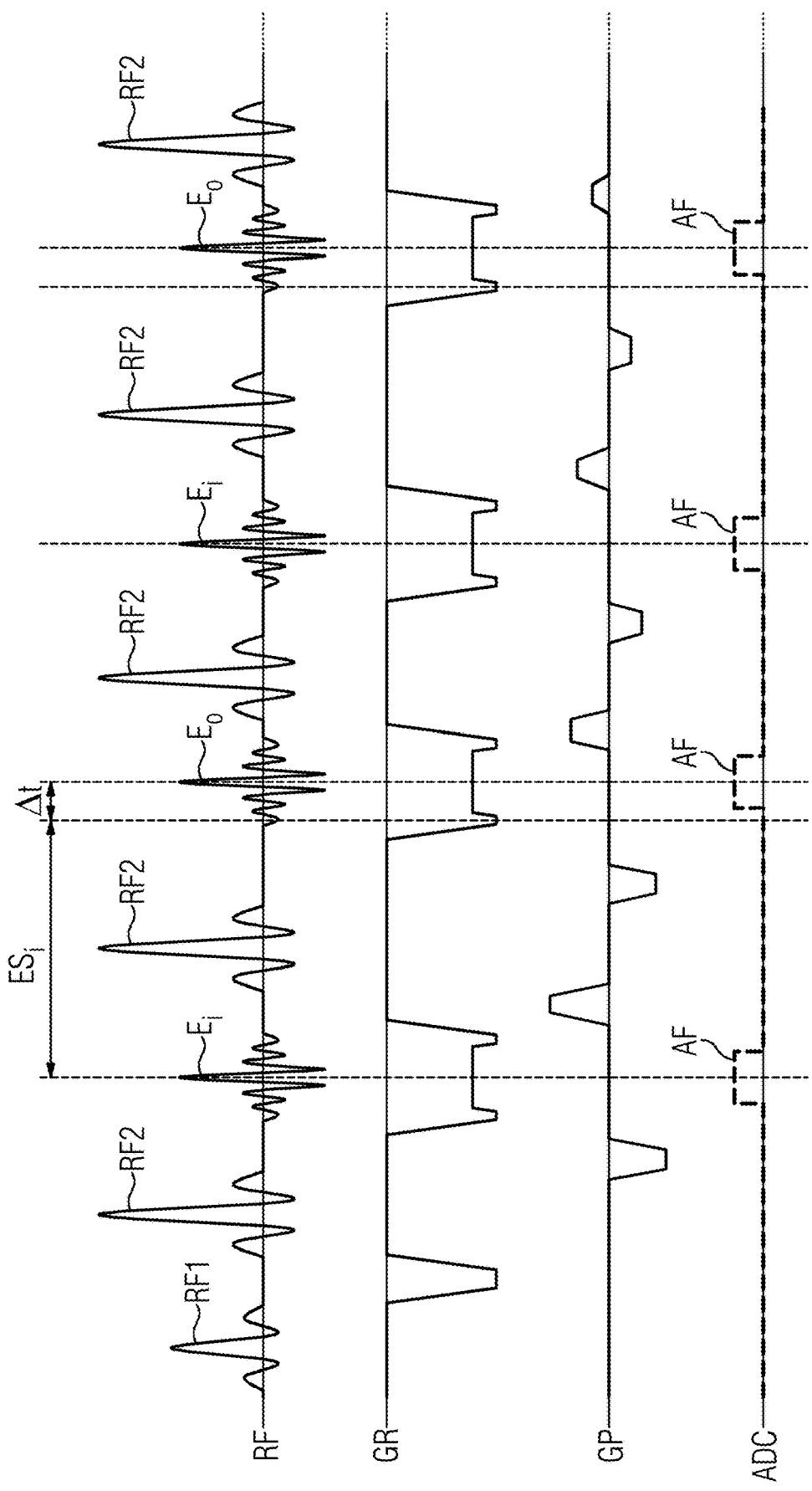
FIG. 5 shows a further example of a sequence pattern.

Examples of sequence patterns applicable in this context are depicted in FIGS. 3 and 5. These depict the respective temporal courses of radio-frequency pulses and signals (RF), activated gradients in the readout direction (GR), activated gradients in the phase encoding direction (GP) and the data recording (ADC) in the relationship to one another. Slice selection gradients are not depicted, but is also possible for slice selection gradients to be activated, in particular simultaneously with the RF excitation pulses RF1 used and/or simultaneously with the RF refocusing pulses RF2 used, for example for two-dimensional measuring methods with which, for example, measurement data are only to be recorded within the slices defined by the slice selection gradients and respective RF pulses. For 3D measuring methods, such as, for example, SPACE, slice selection gradients can be dispensed with.

After an RF excitation pulse RF1, a train of RF refocusing pulses RF2 is radiated at regular time spacings. In the example depicted, the spin echo signal Ei radiated by a first radiated RF refocusing pulse RF2 is read out in a readout window AF if the spins of the different spin species are in phase.

After the reading out of the spin echo signal Ei generated, a further RF refocusing pulse RF2 is radiated. The spin echo signal Eo generated thereby is now shifted, not according to the time duration ESi expected for an "in-phase" echo Ei between two "in-phase" echoes ("echo spacing"), but by a time difference Δt if the spins of the different spin species are read out in opposed phase as an "opposed-phase" echo during an associated readout window AF. The time difference is obtained from the chemical shift between the different spin species.

The spin echo signal Ei generated by the following RF refocusing pulse RF2 is read out again during a readout window AF if the spins of the different spin species are in phase so that a spin echo signal Ei ("in-phase") and a spin echo signal Eo ("opposed-phase") are always recorded in alternation. In the examples depicted, the readout windows AF are arranged such that the first and second time point in each case lie in the middle of the respective readout windows, i.e. that the "in-phase" or "opposed-phase" condition are in each case satisfied in the temporal middle of the readout window. In this way, the measurement data is acquired symmetrically in k-space.

To keep the sequence as short as possible, the regular time spacing of the RF refocusing pulses radiated after a common RF excitation pulse RF1 can be selected such that it corresponds to the short "in-phase" echo spacing ESi.

During the reading out of the spin echoes, a monopolar, constant readout pulse can be activated in each case. This enables chemical shift artifacts to be avoided in a simple manner. Before and after the readout windows, further gradients can be activated in the readout direction in order, for example, to destroy unwanted signals ("crusher" gradients).

For the spatial encoding of the spin echo signals Ei, Eo recorded in the readout windows as measurement data MDS1, MDS2, phase encoding gradients are also activated in the phase encoding direction GP.

As in the example depicted in FIG. 3, in each case two successive spin echo signals Ei and Eo can be recorded with the same phase encoding gradients in the phase encoding direction GR, between the respective RF refocusing pulse RF2 and the following spin echo signal Ei or Eo. This enables each phase encoding step to be recorded in each case for both spin echo signals to be recorded, Ei and Eo. The fact that "in-phase" spin echo signals Ei and "opposed-phase" spin echo signals Eo are hence recorded with only a small time offset with the same spatial encoding means that the images BDS1 and BDS2 reconstructed later from the measurement data MDS1 and MDS2 can be processed particularly well with one another to form images that depict only one of the spin species without it being necessary to take account of artifacts caused by a movement of the examination object.

The example of a sequence pattern shown in FIG. 5 only differs from that shown in FIG. 3 only in a different type of phase encoding in that two successively generated spin echo signals Ei and Eo are in each case encoded with different phase encoding gradients in the phase encoding direction GR. For each spin echo signal to be read out of an RF refocusing pulse RF2 of a train of RF refocusing pulses RF2 after a common RF excitation pulse RF1, in each case another phase encoding gradient is activated, from a series of phase encoding gradients required to satisfy the Nyquist condition. The "another" phase encoding gradient can be the next gradient in a series ranked according to amplitude.

If, overall, more than one RF excitation pulse RF1 followed by a train of RF refocusing pulses RF2 is radiated for each measurement volume to be recorded, for example for each slice of the examination object to be recorded, the phase encoding can take place such that, during the recording of the spin echo signals of every second train of RF refocusing pulses RF2, the "in-phase" spin echo signals Ei are in each case encoded with a phase encoding gradient with which an "opposed-phase" spin echo signal Eo was encoded in the preceding train of RF refocusing pulses RF2. Also, the "opposed-phase" spin echo signals Eo are in each case encoded with a phase encoding gradient with which an "in-phase" spin echo signal Ei was encoded in the preceding train of RF refocusing pulses RF2. In this way, overall all "in-phase" spin echo signals Ei and all "opposed-phase" spin echo signals Eo can be encoded with all the phase encoding gradients required by the Nyquist theorem.

The train of RF refocusing pulses RF2 includes as many RF refocusing pulses RF2 as spin echo signals E1 and E2 are to be generated and read out. This can, for example, be checked by a query 213 that ensures that further RF refocusing pulses RF2 can be radiated if not all the desired spin echo signals E1 and E2 have been recorded and stored as measurement data MDS1 and MDS2 (query 213, "n"). If desired, it is also possible to initiate the radiation of a new RF excitation pulse RF1 followed by a further train of RF refocusing pulses RF2.

If all the desired/to-be-recorded measurement data MDS1 and MDS2 has been read out (query 213, "y"), a first image BDS1 can be reconstructed from measurement data MDS1 recorded in readout windows comprising the first time point recorded and a second image BDS2 reconstructed from measurement data MDS2 recorded in readout windows comprising the second time point (block 215).

At least one specific image SB showing only one of the different spin species can be reconstructed from the first and second reconstructed images BDS1 and BDS2. For example, a fat and/or a water image can be created in a manner usual with Dixon methods from the first image BDS1 and the second image BDS2.

Herein, the entity of k-space can be recorded (filled) for the measurement data MDS1 and MDS2 in each case. For example, to this end, it is possible with a sequence pattern according to FIG. 3, for each phase encoding gradient required to satisfy the Nyquist condition to be performed for each type of spin echo signal to be recorded. A complete recording of the measurement data MDS1 and MDS2 of this kind can improve the signal-to-noise ratio.

It is also conceivable, so as to shorten the necessary length of the train of RF refocusing pulses RF2, and hence the measuring time, to read out only a part of the measurement data required by the Nyquist theorem, i.e. to record the measurement data MDS1 and MDS2 only incompletely (undersampled). The "missing" measurement data can be supplemented by means of supplementary procedures (block 217), before images BDS1, BDS2 are reconstructed. To this end, it may be necessary to determine calibration data KD (block 219).

Figure 4:
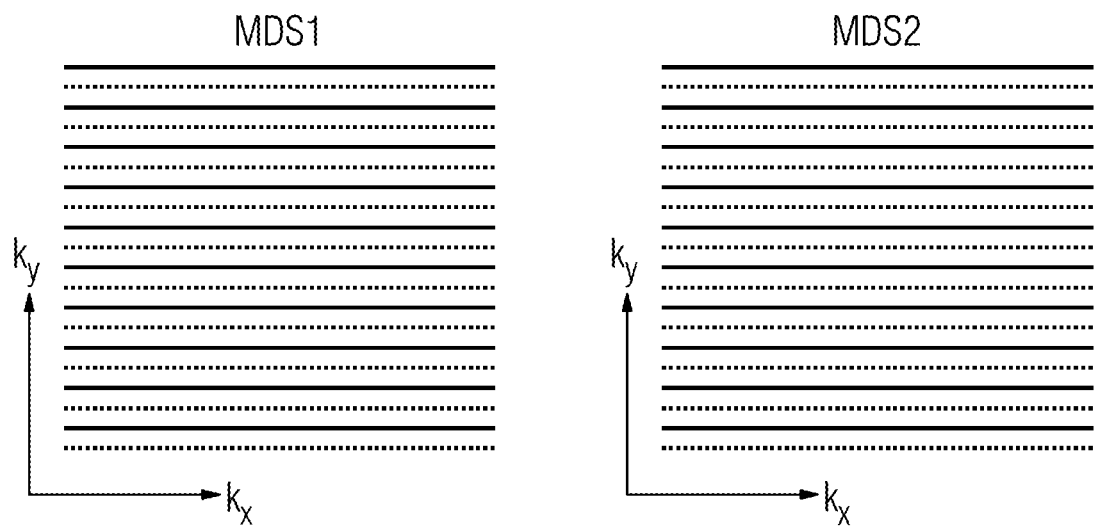
FIG. 4 shows an example of a possible sampling pattern of k-space with the sequence pattern according to FIG. 2.

For an incomplete reading out of the measurement data MDS1 and MDS2 of this kind, it is possible, for example with a sequence pattern according to FIG. 3, to in each case fill every second k-space line to be recorded for the measurement data MDS1 and for the measurement data MDS2. As a result, the sampling patterns depicted in FIG. 4 are obtained for the measurement data MDS1 and MDS2. The recorded measurement data in each case are depicted as continuous k-space lines and omitted, non-recorded measurement data depicted as dashed k-space lines. Hence, the sampling patterns depicted correspond to conventional single-slice GRAPPA sampling in which every second k-space line in one spatial direction (here: $k_y$ direction) is omitted and hence only half k-space points are measured, corresponding to an acceleration factor of 2.

Figure 6:
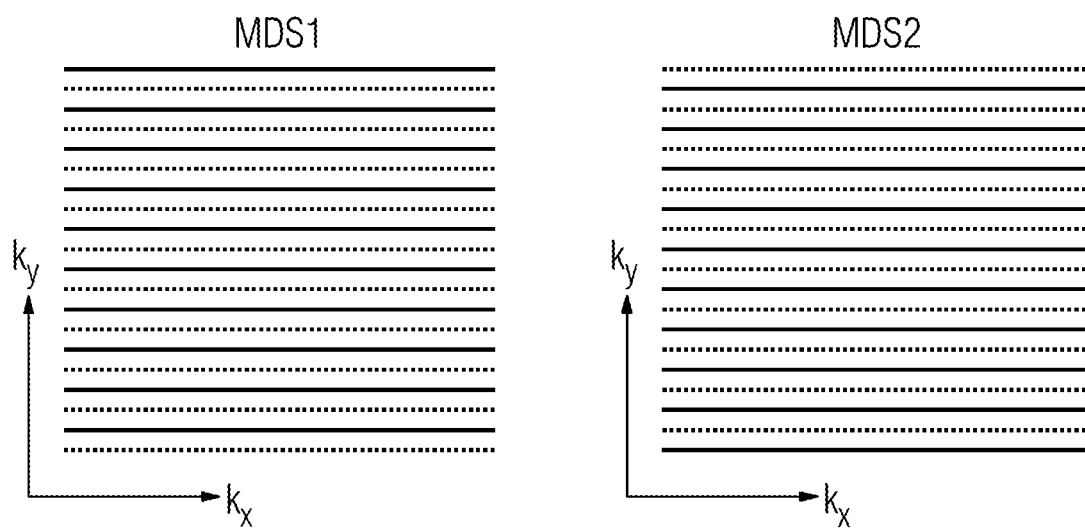
FIG. 6 shows an example of a possible sampling pattern of k-space with the sequence pattern according to FIG. 4.

It is also possible, for example with a sequence pattern according to FIG. 5, for in each case every second k-space line to be recorded for the measurement data MDS1 and the measurement data MDS2, such that sampling patterns for the measurement data MDS1 and MDS2 such as depicted by way of example in FIG. 6 are obtained. There, once again, in each case recorded measurement data is depicted as continuous k-space lines and omitted, non-recorded measurement data as dashed k-space lines. In contrast to the sampling patterns shown in FIG. 4, here k-space lines recorded in the measurement data MDS1 are those that were not recorded in the measurement data MDS2, and vice versa.

The two sets of measurement data MDS1 and MDS2 can in each case be supplemented with supplementary methods, such as afore-mentioned parallel acquisition methods, for example GRAPPA.

If a supplementary method is used that requires calibration data, the calibration data can be recorded directly after a last RF refocusing pulse of a train of RF refocusing pulses and/or created based on the recorded measurement data recorded.

If calibration data of this kind are recorded with a different sequence type than the measurement data to be completed of the actual measurement, due to possible possibly different contrasts and/or different sensitivities to different disruptions, this can result can in artifacts in the supplementation of the measurement data. Therefore, such data are preferably also recorded with a (T)SE sequence.

The time point at which the calibration data are recorded compared to the measurement data, can also result in artifacts during the supplementation, for example due to (unwanted) movements of the examination object. Therefore, the recording of the calibration data can be performed following the recording of measurement data in order to reduce sensitivity to physiological movements, as described, for example, in DE102016207641.

The two sets of measurement data MDS1 and MDS2 can also be advantageously combined with one another for a supplementary method of this kind, as described in DE102016219052B3, for example. In this way, the combination of the two sets of measurement data MDS1 and MDS2 enables a higher SNR in the images BDS1 and BDS2 reconstructed from measurement data recorded after supplementation by means of the calibration data and higher acceleration factors in the context of the parallel acquisition technique with which the measurement data MDS1 and MDS2 are recorded, even if the technique is only implemented with only a few reception channels (receiving coils). Independent sets of "in-phase" and "opposed-phase" calibration data are to be created for each set of measurement data MDS1 and MDS2 in each case. Due to the offset of the read-out k-space lines in the two sets of measurement data MDS1 and MDS2, a sampling pattern according to FIG. 6 enables particularly high acceleration factors, since the two sets of measurement data can almost be considered to be different slices as in a slice multiplexing method. To be precise, the depicted offset of k-space lines has the result that k-space data contained in MDS1 have a different image space phase than k-space data contained in MDS2. Hence, sampling patterns are obtained that resemble the sampling patterns in, for example, the slice multiplexing technique CAIPIRINHA (see, for example, Breuer et al. "Controlled Aliasing in Parallel Imaging Results in Higher Acceleration (CAIPIRINHA) for Multi-Slice Imaging", Magnetic Resonance in Medicine 53, pp 684-691 (2005)), as a result, the techniques used there can also be used here, wherein the different phase positions of the spins ("in-phase" and "opposed-phase") replace the different layers of the slice multiplexing technique.

With a single-shot method, such as HASTE, substantially all measurement data MDS1 and MDS2 for the reconstruction of a first and second image after a single RF excitation pulse can be generated and recorded in an advantageously short time. Hence, the measuring time can be reduced so that in particular even a breath-holding phase of a patient to be examined as an examination object U can be sufficient to record all the measurement data. In addition, the short measuring time minimizes the sensitivity of the measurement data to motion artifacts.

Figure 7:
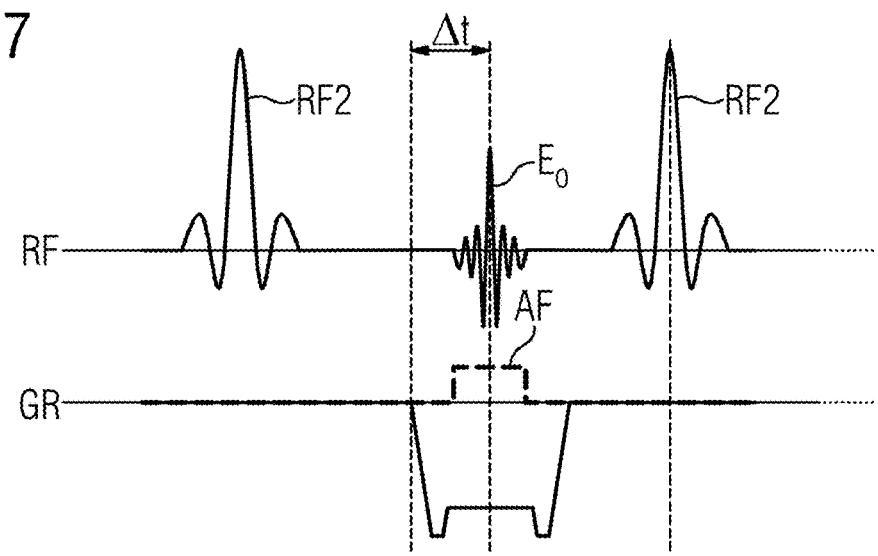
FIG. 7-9 are schematic depictions of possible time coordinations of RF refocusing pulses and readout windows.
Figure 8:
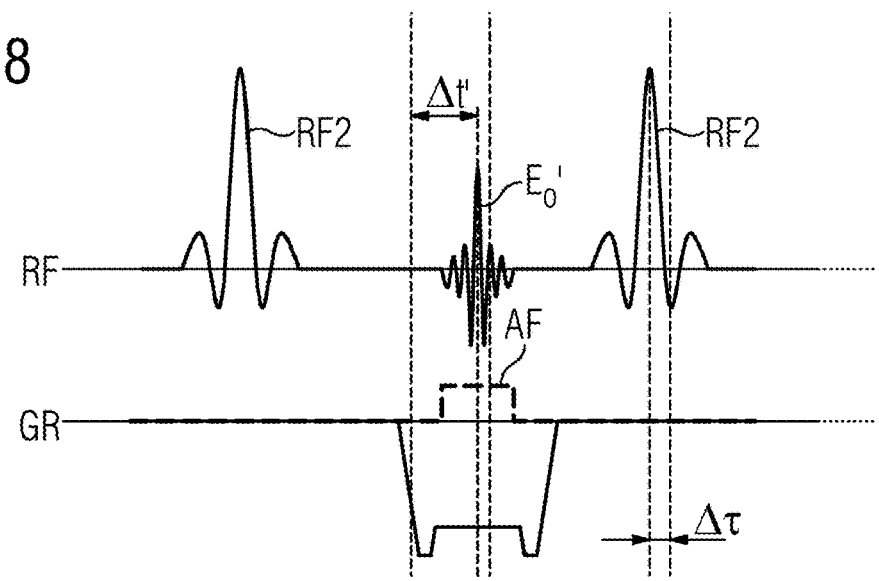
Figure 9:
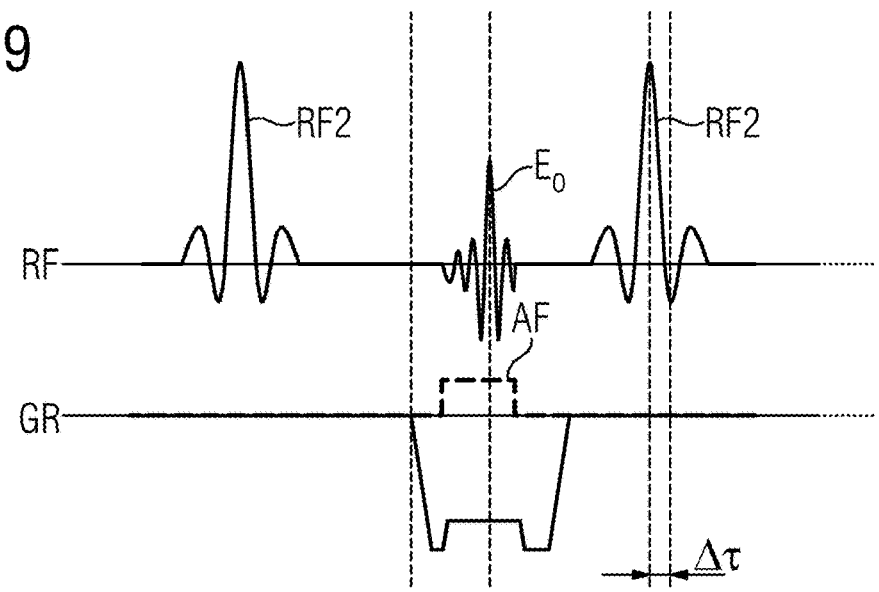

FIGS. 7 to 9 are schematic depictions comparing possible temporal coordinations of RF refocusing pulses and readout windows for reading out "opposed-phase" spin echo signals Eo, wherein, for clarity, the readout windows AF are also depicted on the readout gradient line GR.

FIG. 7 again depicts a situation such as that already shown in FIGS. 3 and 5: after an RF refocusing pulse, a spin echo signal Eo is read out that, as described above, is shifted by the aforementioned time difference $\Delta t$ compared to an "in-phase" spin echo signal Ei, while a readout gradient is activated in the readout direction GR. This is followed by a further RF refocusing pulse RF2. Herein, the readout window AF is arranged such that the second time point (=when the excited different spin species have an opposed phase) lies in the middle of the associated readout window AF.

FIGS. 8 and 9 illustrate strategies for reducing the time spacing of successive RF refocusing pulses by a time period $\Delta\tau$. The reduction $\Delta\tau$ achieved in each case in the examples shown in FIGS. 8 and 9 is only shown as the same length in order to simplify the depiction. The actual reductions $\Delta\tau$ achieved can quite feasibly differ and the strategies described below can also be combined. The reduction of the time spacing of successive RF refocusing pulses enables the measuring time to be further reduced.

The reduction strategy shown in FIG. 8 includes reading out the spin echo signals not exactly at the respective first or second time point, but in particular before the respective time points are reached. To this end, FIG. 8 shows an example of how a "opposed-phase" spin echo signal Eo' is read out in a readout window AF with a time difference $\Delta'$, which is shorter than the time difference $\Delta t$, after the first time point (the "in-phase" condition is achieved when the different excited spin species are in phase). The readout window AF is again arranged such that the second time point lies in the middle of the associated readout window AF. Dixon methods are known which can also be performed with measured values of this kind that are not recorded exactly at a first or second time point.

The reduction strategy depicted in FIG. 9 uses an asymmetric sampling pattern. The spin echo signal is only partially read out. In the example depicted, the "opposed-phase" spin echo signal Eo is read out such that the measured values are only read out on a shortened k-space line with an incomplete right half. The recorded measurement data are stored as asymmetric measurement data. Herein, the readout window AF is hence arranged such that the second time point (fulfilment of the "opposed-phase" condition) lies in the second half of the readout window and hence more measurement data is acquired before the fulfilment of the "opposed-phase" condition than after the fulfilment of the "opposed-phase" condition. In order, nevertheless, to maintain the Carr-Purcell-Meiboom-Gill condition for the pulse sequence, after the readout window a gradient with a higher amplitude can be activated, which can also be combined with a subsequent crusher gradient.

Figure 10:
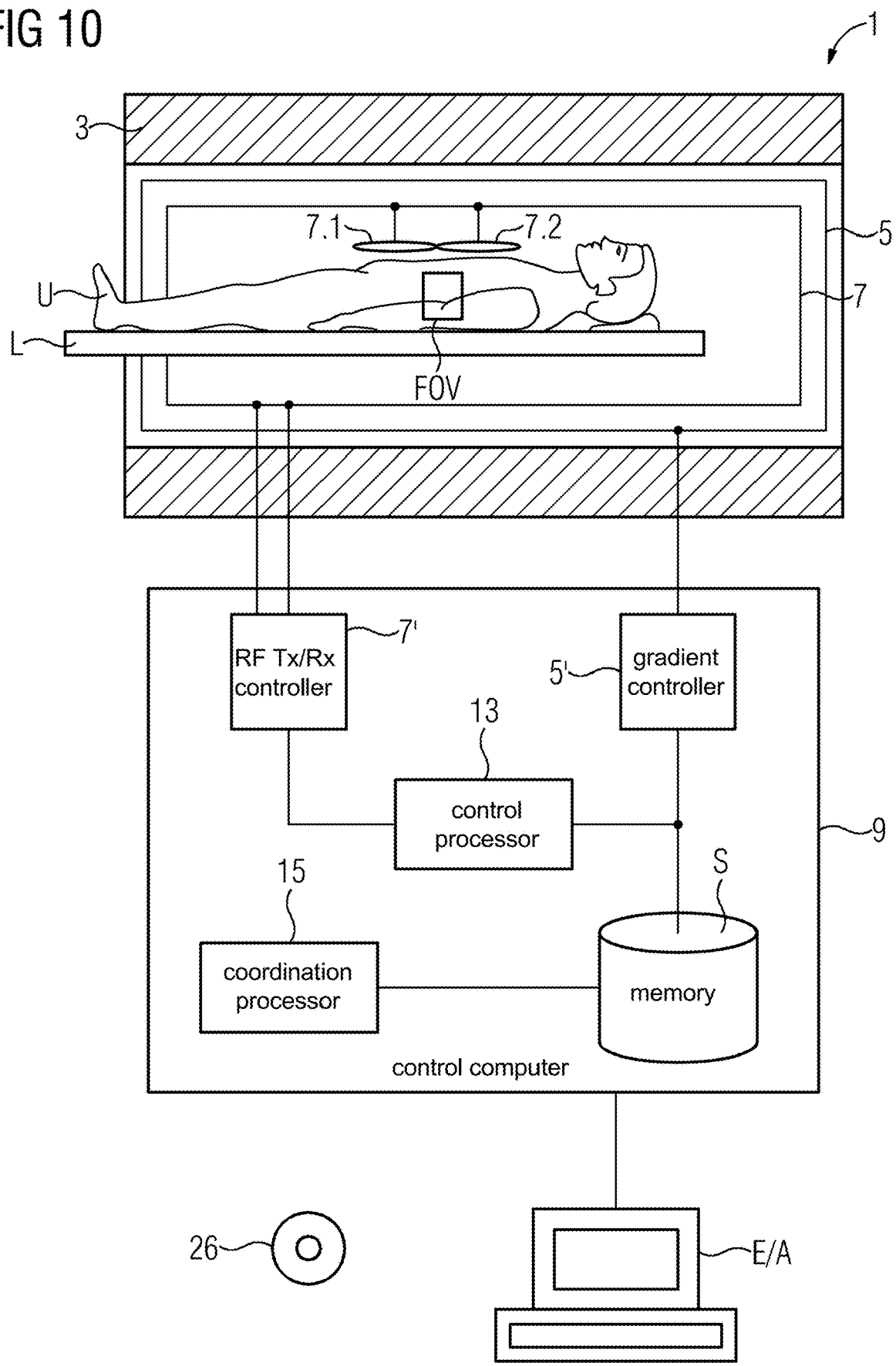
FIG. 10 is a schematic depiction of a magnetic resonance apparatus according to the invention.

FIG. 10 is a schematic depiction of a magnetic resonance apparatus 1 according to the invention. This has a scanner 3 with a basic field magnet that generates the basic magnetic field, a gradient unit 5 that generates the gradient fields, a radio-frequency unit 7 that radiates and receives radio-frequency signals, and a control computer 9 designed (programmed or configured) to perform the method according to the invention. FIG. 10 is only a basic schematic depiction of these subunits of the magnetic resonance apparatus 1. In particular, the radio-frequency unit 7 can have a number of subunits, in particular at least two coils, such as the schematically depicted coils 7.1 and 7.2, which can be designed either only to transmit radio-frequency signals or only to receive the triggered radio-frequency signals, or for both.

For the examination of an examination object U, for example a patient or a phantom, this object U can be introduced into the measurement volume FOV of the scanner 3 on a bed L.

The control computer 9 controls the magnetic resonance apparatus 1 and can in particular control the gradient unit 5 by a gradient controller 5' and the radio-frequency unit 7 by means of a radio-frequency transmitting/receiving controller 7'. The radio-frequency unit 7 can have multiple channels in which signals can be transmitted or received.

The radio-frequency unit 7 together with its radio-frequency transmitting/receiving controller 7' is responsible for generating and radiating (transmitting) a radio-frequency alternating field for manipulating the spins in a region to be manipulated, for example a slice, of the examination object U. The center-frequency of the radio-frequency alternating field, also called the B1 field, should lie close to the resonance frequency of the spins to be manipulated of the desired spin species. To generate the B1 field, currents controlled by the radio-frequency transmitting/receiving controller 7' are applied to the RF coils in the radio-frequency unit 7.

The control computer 9 also has a coordination processor 15 that coordinates readout windows with the phase positions of the different spin species in the examination object U.

A control processor 13 of the control computer 9 is designed to carry out all the computing operations required for the necessary measurements and determinations. Interim results required to this end or determined herein, can be stored in a memory S of the control computer 9. The units depicted are not necessarily physically separate units—they merely represent a subdivision into coherent units, which can also be implemented, for example, in just a few or even only a single physical unit.

An operator user can use an input/output device E/A of the magnetic resonance apparatus 1 to enter control commands into the magnetic resonance apparatus 1 and/or to view results of the control computer 9 such as image data.

A non-transitory, electronically readable data carrier 26 can be provided with electronically readable control information (program code) stored therein. The program code cause the control computer 9 to carry out the described method when the data carrier 26 is loaded into the control computer 9.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for creating a first image dataset and a second image dataset of an examination object in a measurement volume of a magnetic resonance system, said object comprising at least two different spin species, said method comprising:
   radiating an RF excitation pulse into the examination object;
   radiating a train of at least two RF refocusing pulses into the examination object after the radiation of the RF excitation pulse in order to generate a spin echo signal after each radiated RF refocusing pulse;
   activating phase encoding gradients for encoding the phases of the spin echo signals generated;
   activating readout gradients in each case in a readout window in order to read out the generated spin echo signals, as measurement data, with the readout windows alternately comprising a first time point at which the phases of the different spin species in the spin echo signal are the same, and a second time point at which the phases of the different spin species in the spin echo signal are not the same;
   storing the measurement data during the readout windows;
   reconstructing a first image from measurement data recorded in readout windows comprising the first time point; and
   reconstructing a second image from measurement data recorded in readout windows comprising the second time point.

2. The method as claimed in claim 1, wherein the phases of the different spin species in the spin echo signal are opposed at the second time point.

3. The method as claimed in claim 1, wherein the readout gradients are monopolar.

4. The method as claimed in claim 1, comprising generating the readout windows so the first and the second time point each lie in the middle of the respective readout windows.

5. The method as claimed in claim 1, comprising storing the measurement data that were read out during the readout windows that comprise the second time point as asymmetric measurement data.

6. The method as claimed in claim 1, comprising reading out and storing substantially all the measurement data for the reconstruction of the first image or the second image after a single RF excitation pulse.

7. The method as claimed in claim 1, comprising reading out and storing the measurement data for the reconstruction of the first image or the second image after a plurality of RF excitation pulses.

8. The method as claimed in claim 1, comprising encoding two successively generated spin echo signals with the same phase encoding gradients.

9. The method as claimed in claim 1, comprising encoding two successively generated spin echo signals with different phase encoding gradients.

10. The method as claimed in claim 1, wherein the measurement data stored for the reconstruction of the first image or the second image are incomplete with respect to the Nyquist criterion, and supplementing the incomplete data by supplementary procedures before said first and second images are reconstructed.

11. The method as claimed in claim 10, comprising acquiring calibration data for the supplementary procedures directly after a last RF refocusing pulse of a train of RF refocusing pulses.

12. The method as claimed in claim 10, comprising producing calibration data for said supplementary procedures using said measurement data.

13. The method as claimed in claim 1, comprising creating at least one specific image, which shows only one of the different spin species, from the first and second reconstructed images.

14. The method as claimed in claim 1, further comprising performing a supplementary procedure to supplement the measurement data before the first and second images are reconstructed.

15. The method as claimed in claim 14, comprising acquiring calibration data for the supplementary procedure after a last RF refocusing pulse of a train of RF refocusing pulses.

16. The method as claimed in claim 15, wherein the calibration data is acquired directly after the last RF refocusing pulse.

17. The method as claimed in claim 14, further comprising producing calibration data for the supplementary procedure based on the measurement data.

18. A magnetic resonance apparatus comprising:
   a magnetic resonance data acquisition scanner comprising a radio-frequency (RF) transmitting/receiving arrangement and a gradient coil arrangement; and
   a computer configured to:
      operate the magnetic resonance data acquisition unit in order to radiate an RF excitation pulse into the examination object with said RF transmitting/receiving arrangement;
      operate the magnetic resonance data acquisition unit in order to radiate a train of at least two RF refocusing pulses into the examination object with said RF transmitting/receiving arrangement, after the radiation of the RF excitation pulse in order to generate a spin echo signal after each radiated RF refocusing pulse;
      operate the magnetic resonance data acquisition unit in order to activate phase encoding gradients with said gradient coil arrangement for encoding the phases of the spin echo signals generated;
      operate the magnetic resonance data acquisition unit in order to activate readout gradients with said gradient coil arrangement in each case in a readout window in order to read out the generated spin echo signals, as measurement data, with the readout windows alternately comprising a first time point at which the phases of the different spin species in the spin echo signal are the same, and a second time point at which the phases of the different spin species in the spin echo signal are not the same;
      operate the magnetic resonance data acquisition unit in order to store the measurement data during the readout windows;
      reconstruct a first image from measurement data recorded in readout windows comprising the first time point; and
      reconstruct a second image from measurement data recorded in readout windows comprising the second time point.

19. A non-transitory, computer-readable data storage medium encoded with programming instructions, said storage medium being loaded into a computer of a magnetic resonance apparatus, and said programming instructions causing said computer to:
- operate the magnetic resonance apparatus in order to radiate an RF excitation pulse into the examination object;
- operate the magnetic resonance apparatus in order to radiate a train of at least two RF refocusing pulses into the examination object after the radiation of the RF excitation pulse in order to generate a spin echo signal after each radiated RF refocusing pulse;
- operate the magnetic resonance apparatus in order to activate phase encoding gradients for encoding the phases of the spin echo signals generated;
- operate the magnetic resonance apparatus in order to activate readout gradients in each case in a readout window in order to read out the generated spin echo signals, as measurement data, with the readout windows alternately comprising a first time point at which the phases of the different spin species in the spin echo signal are the same, and a second time point at which the phases of the different spin species in the spin echo signal are not the same;
- operate the magnetic resonance apparatus in order to store the measurement data during the readout windows;
- reconstruct a first image from measurement data recorded in readout windows comprising the first time point; and
- reconstruct a second image from measurement data recorded in readout windows comprising the second time point.

* * * * *